(12) United States Patent
Tien et al.

(10) Patent No.: US 11,906,844 B2
(45) Date of Patent: *Feb. 20, 2024

(54) LIGHT EMITTING DEVICE, BACKLIGHT, AND DISPLAY PANEL WITH REFLECTIVE LAYER

(71) Applicant: Lextar Electronics Corporation, Hsinchu (TW)

(72) Inventors: Yun-Yi Tien, Hsinchu (TW); Yu-Chang Wu, Hsinchu (TW); Yu-Li Chang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/151,403

(22) Filed: Jan. 6, 2023

(65) Prior Publication Data
US 2023/0161194 A1   May 25, 2023

Related U.S. Application Data

(63) Continuation of application No. 17/454,820, filed on Nov. 14, 2021, now Pat. No. 11,579,486.

(30) Foreign Application Priority Data

Nov. 20, 2020   (CN) .......................... 202011306944.3

(51) Int. Cl.
*G02F 1/13357*   (2006.01)
*G02F 1/1335*   (2006.01)
(Continued)

(52) U.S. Cl.
CPC .. *G02F 1/133603* (2013.01); *G02F 1/133607* (2021.01); *G02F 1/133611* (2013.01);
(Continued)

(58) Field of Classification Search
CPC ......... G02F 1/133603; G02F 1/133607; G02F 1/133611; G02F 1/133614; G02F 2202/36;
(Continued)

(56) References Cited

U.S. PATENT DOCUMENTS 7,887,225 B2   2/2011   Lee et al.
8,208,093 B2   6/2012   Shinozaki et al.
(Continued)

FOREIGN PATENT DOCUMENTS

CN   203363863 U   12/2013
CN   109654404 A   4/2019
(Continued)

OTHER PUBLICATIONS

Li, cn114428421, machine translation May 2022 (Year: 2022).*

*Primary Examiner* — Tracie Y Green
(74) *Attorney, Agent, or Firm* — CKC & Partners Co., LLC

(57) ABSTRACT

A light emitting device includes a substrate, a conductive layer, first and second reflective layers, a light emitting element, and an encapsulation layer. The conductive layer is disposed on the substrate. The first reflective layer covers the conductive layer and has an opening exposing a portion of the conductive layer. The light emitting element is disposed in the opening and electrically connects to the conductive layer. The second reflective layer is disposed on the first reflective layer and surrounds the light emitting element. The second reflective layer has an outer diameter. A top surface of the second reflective layer is lower than a top surface of the light emitting element. The encapsulation layer covers the light emitting element. There is a height between a highest point of the encapsulation layer and an
(Continued)

upper surface of the first reflective layer. The encapsulating layer is directly contact with the outer diameter.

13 Claims, 11 Drawing Sheets

(51) Int. Cl.
  *H01L 33/54* (2010.01)
  *H01L 33/60* (2010.01)
  *H01L 33/00* (2010.01)
(52) U.S. Cl.
  CPC ...... *G02F 1/133614* (2021.01); *H01L 33/005* (2013.01); *H01L 33/54* (2013.01); *H01L 33/60* (2013.01); *G02F 2202/36* (2013.01); *H01L 2933/005* (2013.01); *H01L 2933/0058* (2013.01)
(58) Field of Classification Search
  CPC ....... H01L 33/005; H01L 33/54; H01L 33/60; H01L 2933/005; H01L 2933/0058
  See application file for complete search history.

(56) References Cited

U.S. PATENT DOCUMENTS

| | | | |
|---|---|---|---|
| 8,829,776 B2 | 9/2014 | Yamamoto et al. | |
| 10,595,367 B2 | 3/2020 | Yamada | |
| 11,579,486 B2* | 2/2023 | Tien | H01L 33/60 |
| 2004/0129945 A1* | 7/2004 | Uemura | H01L 33/507 |
| | | | 257/E33.073 |
| 2009/0146155 A1 | 6/2009 | Wang et al. | |
| 2011/0227110 A1 | 9/2011 | Kim et al. | |
| 2012/0138990 A1 | 6/2012 | Sato et al. | |
| 2013/0037830 A1 | 2/2013 | Jang | |
| 2015/0176807 A1 | 6/2015 | Park et al. | |
| 2017/0263816 A1 | 9/2017 | Yang et al. | |
| 2018/0040785 A1 | 2/2018 | Peng et al. | |
| 2018/0045395 A1 | 2/2018 | Kamada | |
| 2018/0261741 A1 | 9/2018 | Welch et al. | |
| 2019/0113208 A1 | 4/2019 | Chan et al. | |
| 2019/0198484 A1 | 6/2019 | Yamada | |
| 2019/0257499 A1 | 8/2019 | Fujikawa et al. | |
| 2019/0305197 A1 | 10/2019 | Yamada | |
| 2020/0136092 A1 | 4/2020 | Kim | |
| 2021/0240040 A1 | 8/2021 | Li et al. | |
| 2022/0077121 A1 | 3/2022 | Bae et al. | |
| 2022/0146741 A1 | 5/2022 | Kim et al. | |

FOREIGN PATENT DOCUMENTS

| | | | |
|---|---|---|---|
| CN | 109830590 A | | 5/2019 |
| CN | 110071208 A | | 7/2019 |
| CN | 110858599 A | | 3/2020 |
| CN | 114428421 A | * | 5/2022 |
| CN | 114428421 A | | 5/2022 |
| JP | 2006-351808 A | | 12/2006 |
| JP | 2007-251043 A | | 9/2007 |
| JP | 2009-194112 A | | 8/2009 |
| JP | 2012-114468 A | | 6/2012 |
| KR | 20070087338 A | | 8/2007 |
| TW | 200616244 A | | 5/2006 |
| WO | 2012141094 A1 | | 10/2012 |

* cited by examiner

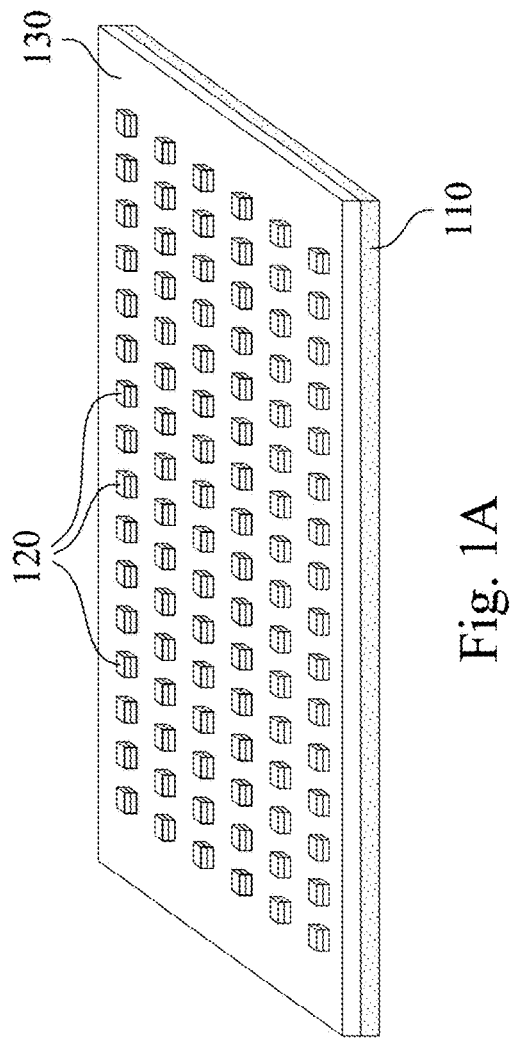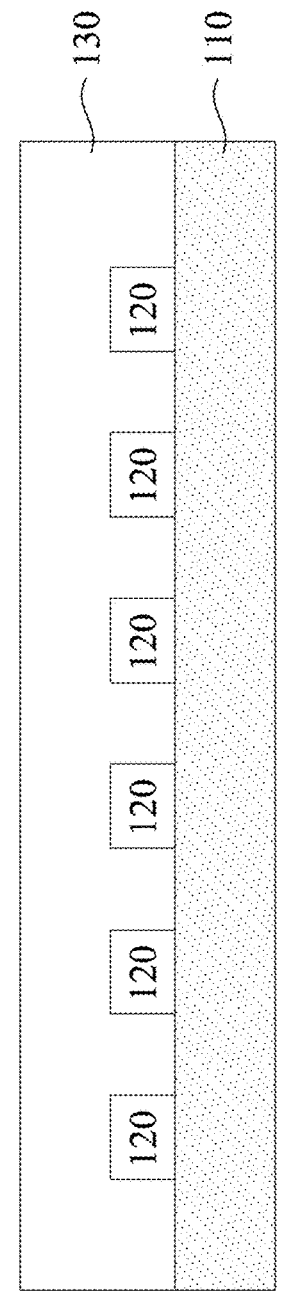
Fig. 1A
Fig. 1B

LIGHT EMITTING DEVICE, BACKLIGHT, AND DISPLAY PANEL WITH REFLECTIVE LAYER

CROSS-REFERENCE TO RELATED APPLICATION

This application is a Continuation of U.S. Application Ser. No. 17/454,820, field on Nov. 14, 2021, which claims priority of China Application Serial Number 202011306944.3, filed on Nov. 20, 2020, the entirety of which is incorporated by reference herein in their entireties.

BACKGROUND

Field of Invention

The present disclosure relates to a light emitting device, a backlight, and a display panel.

Description of Related Art

With the advancement of light emitting diode technologies and increasing market demand, novel display technologies represented by mini-light emitting diodes/micro-light emitting diodes (Mini-LEDs/Micro-LEDs) have emerged.

The Mini-LED packaging mainly includes chip on board (COB) technology and integrated mounted device (IMD) packaging technology. The COB technology is to directly mount the LED chip on the module substrate, and then mold each large unit as a whole. However, various existing COB packaging technology still have many problems such as high production costs, serious light loss, and poor product stabilities.

SUMMARY

In view of this, one goal of the present disclosure is to provide a light emitting device, a backlight, and a display panel capable of addressing the aforementioned issues.

One aspect of the present disclosure is to provide a light emitting device including a substrate, a conductive layer, a first reflective layer, a light emitting element, a second reflective layer, and an encapsulation layer. The conductive layer is disposed on the substrate. The first reflective layer covers the conductive layer and has an opening exposing a portion of the conductive layer. The light emitting element is disposed in the opening and electrically connects to the conductive layer. The second reflective layer is disposed on the first reflective layer and surrounds the light emitting element, and the second reflective layer has an outer diameter. A top surface of the second reflective layer is lower than a top surface of the light emitting element. The encapsulation layer covers the light emitting element. There is a height between a highest point of the encapsulation layer and an upper surface of the first reflective layer, and the height is 0.1 to 0.5 times the outer diameter. The encapsulating layer is in direct contact with the outer diameter of the second reflective layer. The present disclosure also provides a backlight and a display panel.

Another aspect of the present disclosure is to provide a backlight including a plurality of light emitting devices foregoing. Any two adjacent light emitting devices are separated by a distance, and the outer diameter is less than 0.5 times the distance.

Yet another aspect of the present disclosure is to provide a display panel including a backlight foregoing, a lower diffuser, a quantum dot layer, an optical film, an upper diffuser, and a liquid crystal panel. The lower diffuser is disposed on the backlight. The quantum dot layer is disposed on the lower diffuser. The optical film is disposed on the quantum dot layer. The upper diffuser is disposed on the optical film. The liquid crystal panel is disposed over the upper diffuser.

BRIEF DESCRIPTION OF THE DRAWINGS

The disclosure can be more fully understood by reading the following detailed description of the embodiment, with reference made to the accompanying drawings as follows.

FIG. 1A illustrates a three-dimensional schematic view of a light emitting device according to one comparative example of the present disclosure.

FIG. 1B illustrates a cross-section schematic view of the light emitting device of FIG. 1A.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. The embodiments disclosed below may be combined or substituted with each other under beneficial circumstances, and other embodiments may also be added to an embodiment without further description.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

In the following description, certain specific details are set forth in order to provide a thorough understanding of various embodiments of the disclosure. However, one skilled in the art will understand that the disclosure may be practiced without these specific details. Furthermore, for simplifying the drawings, some of the conventional structures and elements are shown with schematic illustrations.

FIG. 1A illustrates a three-dimensional schematic view of a light emitting device 10 according to one comparative example of the present disclosure. FIG. 1B illustrates a cross-section schematic view of the light emitting device 10 of FIG. 1A. Referring to FIGS. 1A and 1B, the light emitting device 10 includes a printed circuit board 110, a plurality of light emitting diodes 120, and an encapsulating glue 130. The light emitting diodes 120 are arranged on the printed circuit board 110 at intervals. The encapsulating glue 130 fully covers the printed circuit board 110 and the light emitting diodes 120. It is noted that the encapsulating glue 130 fully covers the printed circuit board 110 and the light emitting diodes 120 by fully coating method. As a result, the surface flatness of the light emitting device 10 is greatly reduced, and the product specifications cannot be met. Furthermore, this method of fully coating the encapsulating glue 130 will also cover the non-light emitting area of the light emitting device 10 at the same time, and will increase the cost, thereby causing the reduction of the product competitiveness.

Figure 2:
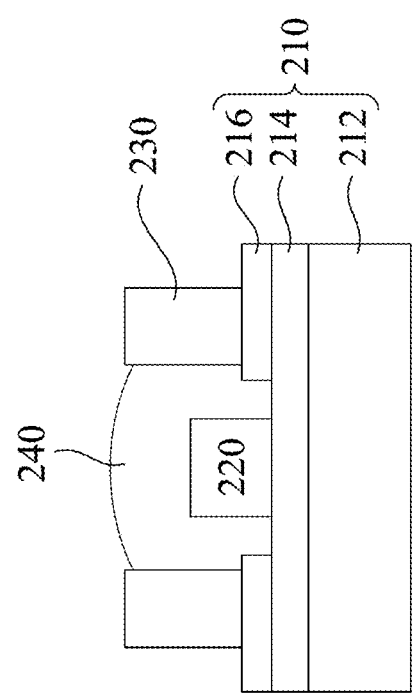
FIG. 2 illustrates a cross-section schematic view of a light emitting device according to another comparative example of the present disclosure.

FIG. 2 illustrates a cross-section schematic view of a light emitting device 20 according to another comparative example of the present disclosure. Referring to FIG. 2, the light emitting device 20 includes a printed circuit board 210, a light emitting diode 220, a ring-shaped dam 230, and an encapsulating glue 240. It can be understood that the printed circuit board 210 includes a substrate 212, a conductive layer 214 disposed on the substrate 212, and a solder protection layer 216 disposed on the conductive layer 214. The light emitting diode 220 is disposed on the conductive layer 214 of the printed circuit board 210 to electrically connect to the conductive layer 214. The ring-shaped dam 230 is disposed on the solder protection layer 216 of the printed circuit board 210 and surrounds the light emitting diode 220. Generally speaking, the ring-shaped dam 230 may be made of insulating material, and the insulating material is, for example, silicon. The encapsulating glue 240 is filled in the ring-shaped dam 230 and covers the light emitting diode 220. Due to the higher viscosity material of the ring-shaped dam 230, the width and height of the ring-shaped dam 230 formed therefrom are both larger than the width and height of the light emitting diode 220. Therefore, the light emitting device 20 is likely to cause light loss and not suitable for forming a large-size light board.

Figure 3:
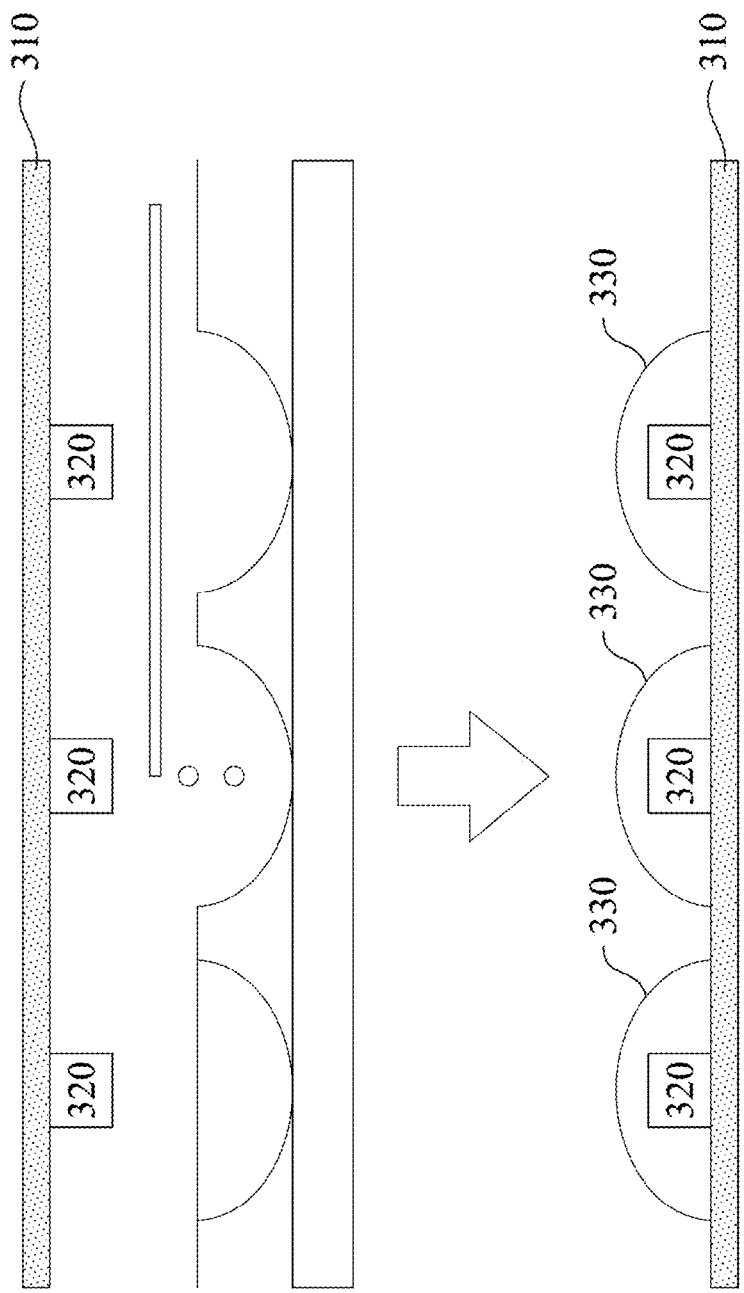
FIG. 3 illustrates a cross-section schematic view of manufacturing a light emitting device according to yet another comparative example of the present disclosure.

FIG. 3 illustrates a cross-section schematic view of manufacturing a light emitting device 30 according to yet another comparative example of the present disclosure. The light emitting device 30 includes a printed circuit board 310, a light emitting diode 320, and a transparent cover 330. The light emitting diode 320 is disposed on the printed circuit board 310. The transparent cover 330 seals the single light emitting diode 320 disposed on the printed circuit board 310. To be specific, the transparent cover 330 is formed by compression molding method. The materials of the transparent cover 330 include silicon resin, epoxy resin, and glass. However, the production and the operation of the compression molding equipment are very expensive, and the stability of the large-size molding products is also poor.

Figure 4:
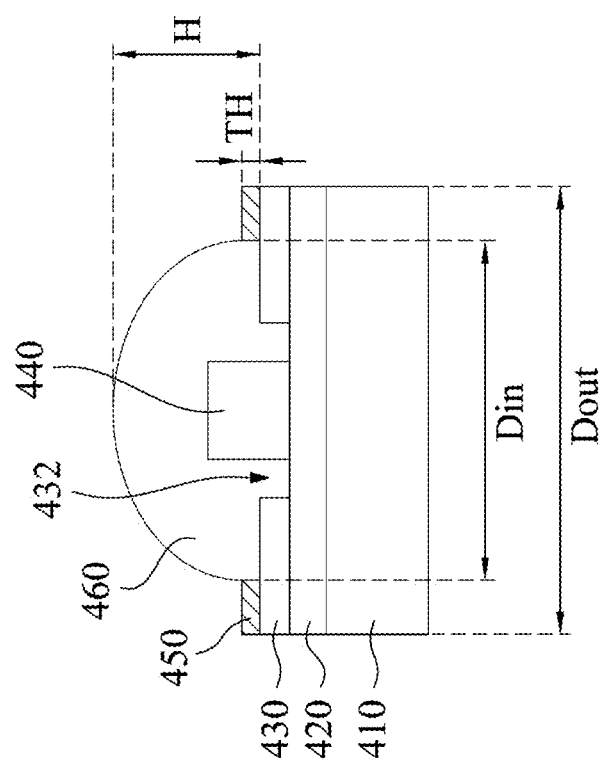
FIG. 4 illustrates a cross-section schematic view of a light emitting device according to one embodiment of the present disclosure.

FIG. 4 illustrates a cross-section schematic view of a light emitting device according to one embodiment of the present disclosure. Referring to FIG. 4, the light emitting device 40 includes a substrate 410, a conductive layer 420, a first reflective layer 430, a light emitting element 440, a second reflective layer 450, and an encapsulating layer 460. In some embodiments, the substrate 410 may be an insulating substrate, an aluminum composite substrate, a flexible substrate, or a ceramic substrate. The conductive layer 420 is disposed on the substrate 410. In some embodiments, the conductive layer 420 may include conductive materials of copper, aluminum, nickel, silver, gold, palladium, or combinations thereof. The first reflective layer 430 covers the conductive layer 420, and the first reflective layer 430 has an opening 432 exposing a portion of the conductive layer 420. In some embodiments, the material of the first reflective layer 430 is a white ink. Specifically, the material of the white ink is a white text ink containing highly reflective titanium dioxide. This material not only has a highly reflectivity, but also has the effects of high heat resistance (for example, yellowing resistance and stress cracking resistance) and high reliability.

Referring to FIG. 4, the light emitting element 440 is disposed in the opening 432 and electrically connected to the conductive layer 420. In some embodiments, the light emitting element 440 may be a mini-LED or a micro-LED. For example, the light emitting element 440 may be a red mini-LED, a red micro-LED, a green mini-LED, a green micro-LED, a blue mini-LED, a blue micro-LED, a yellow mini-LED, a yellow micro-LED, a white mini-LED, or a white micro-LED. In some embodiments, the light emitting element 440 is flip-chip bonded to and in contact with the conductive layer 420.

Referring to FIG. 4, the second reflective layer 450 is disposed on the first reflective layer 430 and surrounds the light emitting element 440. More specifically, the second reflective layer 450 has an outer diameter Dout. In some embodiments, the outer diameter Dout ranges from 2.0 mm to 4.5 mm. For example, the outer diameter Dout may be 2.1 mm, 2.3 mm, 2.5 mm, 2.7 mm, 2.9 mm, 3.0 mm, 3.1 mm, 3.3 mm, 3.5 mm, 3.7 mm, 3.9 mm, 4.0 mm, 4.1 mm, or 4.3 mm. In some embodiments, the second reflective layer 450 has an inner diameter Din, and a difference between the outer diameter Dout and the inner diameter Din ranges from 0.05 mm to 0.6 mm, such as 0.1 mm, 0.15 mm, 0.2 mm, 0.25 mm, 0.3 mm, 0.35 mm, 0.4 mm, 0.45 mm, 0.5 mm, or 0.55 mm. If the difference between the outer diameter Dout and the inner diameter Din is less than a certain value, such as 0.05 mm, the subsequent process of forming the encapsulating layer will cause insufficient cohesion of encapsulating glue, thereby causing the glue to overflow and the height of the encapsulating layer not easy to improve. On the other hand, if the difference between the outer diameter Dout and the inner diameter Din is greater than a certain a value, such as 0.6 mm, the amount of the encapsulating glue used will increase, and the process time for forming the encapsulating layer will also be prolonged.

In some embodiments, the material of the second reflective layer 450 is a white ink. Specifically, the material of the white ink is a white text ink containing highly reflective titanium dioxide. This material not only has a highly reflectivity, but also has the effects of high heat resistance (for example, yellowing resistance and stress cracking resistance) and high reliability. In some embodiments, a top surface of the second reflective layer 450 is lower than a top surface of the light emitting element 440. In some embodiments, a thickness TH of the second reflective layer 450 ranges from 20 um to 60 um, such as 25 um, 30 um, 35 um, 40 um, 45 um, 50 um, or 55 um. If the thickness TH of the second reflective layer 450 is less than a certain value, such as 20 um, the subsequent process of forming the encapsulating layer will cause insufficient cohesion of encapsulating glue, thereby causing the glue to overflow and the height of the encapsulating layer not easy to improve. On the other hand, if the thickness TH of the second reflective layer 450 is greater than a certain a value, such as 60 um, the second reflective layer 450 will be not easy to form and easy to collapse. In some embodiments, the second reflective layer 450 may be formed by printing or coating, so that the expected position, the width, and the thickness of the second reflective layer 450 can be controlled more accurately.

Figure 5C:
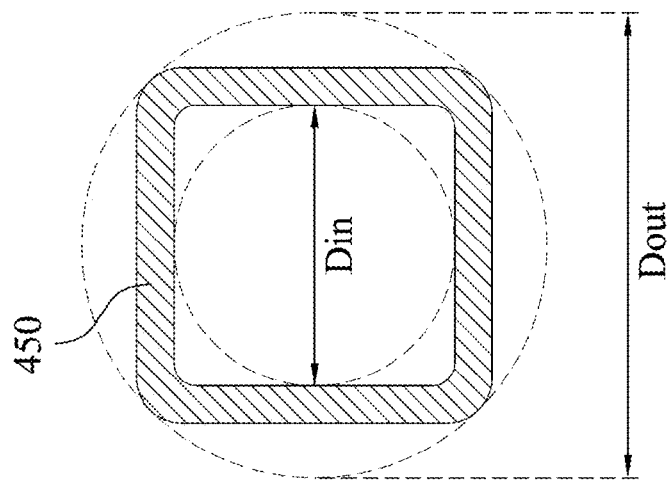
FIGS. 5A, 5B, and 5C illustrate a schematic top view of a second reflective layer according to various embodiments of the present disclosure.
Figure 5B:
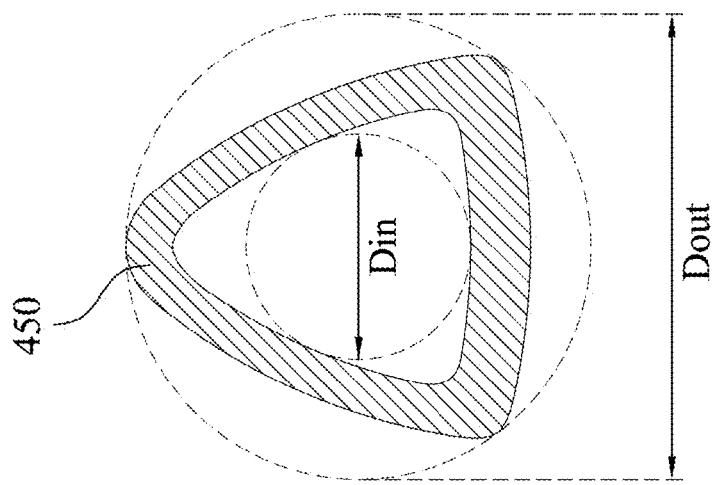
Figure 5A:
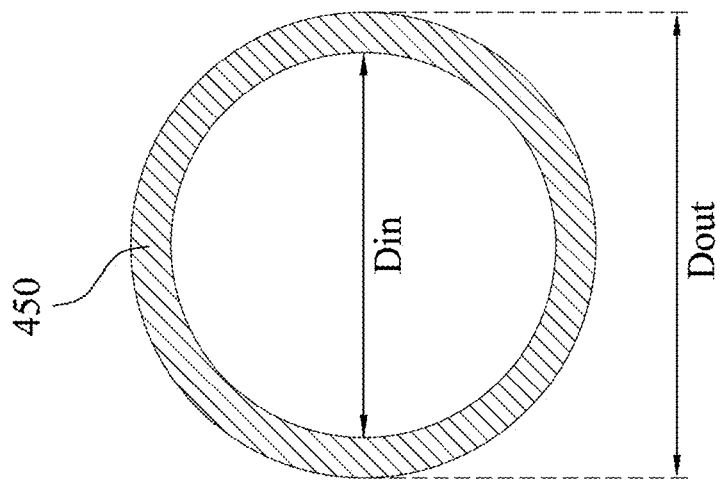

FIGS. 5A, 5B, and 5C illustrate a schematic top view of the second reflective layer 450 according to various embodiments of the present disclosure. As shown in FIG. 5A, the shape of the second reflective layer 450 viewed in the top view direction may be a circle, in one embodiment. As shown in FIG. 5B, the shape of the second reflective layer 450 viewed in the top view direction may be a triangle having fillets, in another embodiment. As shown in FIG. 5C, the shape of the second reflective layer 450 viewed in the top view direction may be a square having fillets, in yet another embodiment. In other alternative embodiments, the shape of the second reflective layer 450 viewed in the top view direction may be a polygon having fillets. It is noted that regardless of the shape of the second reflective layer 450 observed in the top view direction, it has a virtual geometric circumscribed circle (as shown by the dashed line in FIGS. 5A-5C) and a virtual geometric inscribed circle (as shown by the dashed line in FIGS. 5A-5C). The geometric circumscribed circle has an outer diameter Dout and the geometric inscribed circle has an inner diameter Din, and a difference between the outer diameter Dout and the inner diameter Din ranges from 0.05 mm to 0.6 mm.

Referring to FIG. 4 again, the encapsulating layer 460 covers the light emitting element 440. More specifically, there is a height H between a highest point of the encapsulating layer 460 and an upper surface of the first reflective layer 430, and the height H is 0.1 to 0.5 times the outer diameter Dout. For example, the height H may be 0.2, 0.3, or 0.4 times the outer diameter Dout. In some embodiments, the encapsulating layer 460 covers the light emitting element 440 and a portion of the first reflective layer 430, but not covers the second reflective layer 450. In other words, the encapsulating layer 460 is merely disposed within an inner edge of the second reflective layer 450. To put it another way, the range covered by the encapsulating layer 460 only covers the inner diameter Din of the second reflective layer 450. In some embodiments, the encapsulating layer 460 has an arc-shaped outer surface. In some embodiments, the encapsulating layer 460 may be formed by dispensing or jetting. In some embodiments, the encapsulating layer 460 may include an organic packaging material, an inorganic packaging material, or combinations thereof. For example, the organic packaging material includes silicon rubber, acrylic and epoxy resin, while the inorganic packaging material includes silicon dioxide and fluorine adhesive. However, the present disclosure is not limited thereto. The encapsulating layer 460 can increase the area capable to block moisture and protect the light emitting element 440 from moisture, thereby increasing the reliability and service life of the product. In addition, the encapsulating layer 460 may also act as a lens to change the light emitting angle of the light emitting element 440.

Figure 6:
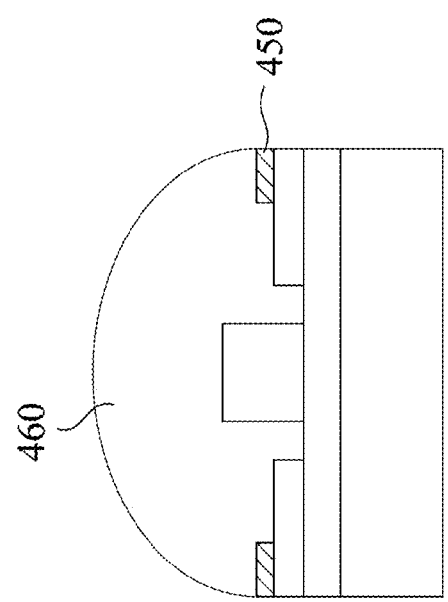
FIG. 6 illustrates a cross-section schematic view of a light emitting device according to one embodiment of the present disclosure.

FIG. 6 illustrates a cross-section schematic view of a light emitting device 60 according to one embodiment of the present disclosure. In order to facilitate the comparison with the aforementioned embodiments and simplify the description, the same reference numbers are used in the following embodiments to refer to the same or like parts. Also, the differences between embodiments are discussed below, and similar parts will not be repeated. The difference between the light emitting device 60 and the light emitting device 40 is that the encapsulating layer 460 of the light emitting device 60 completely covers the second reflective layer 450. Compared with the light emitting device 40, the light emitting device 60 has more uniform light emission and can improve the visual effect of applications thereof.

Figure 7C:
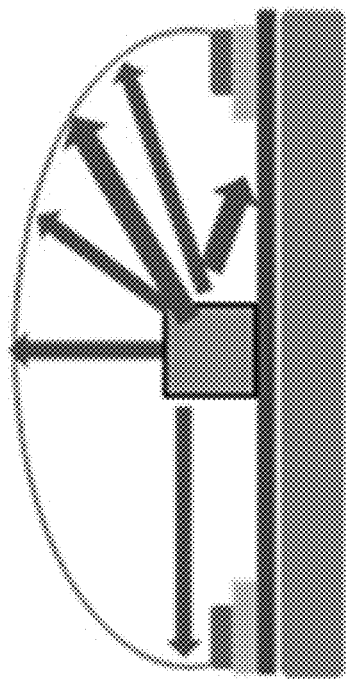
FIG. 7C is a diagram showing a path of light emitted by a light emitting device according to another embodiment of the present disclosure.
Figure 7D:
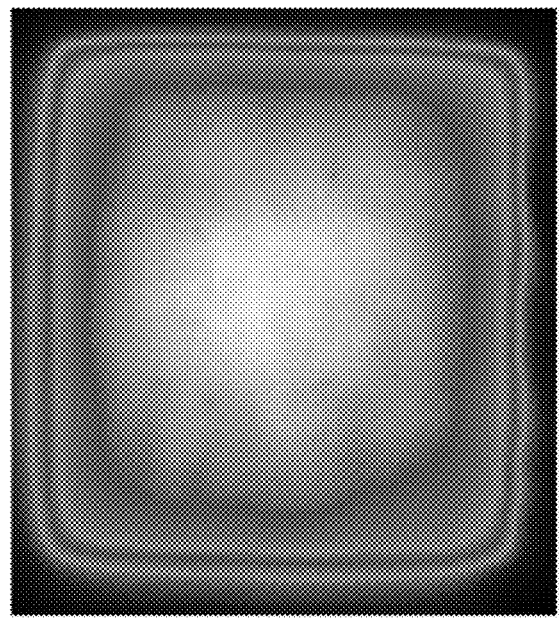
FIG. 7D is a schematic diagram showing the uniformity of light emitted by a light emitting device according to another embodiment of the present disclosure.
Figure 7A:
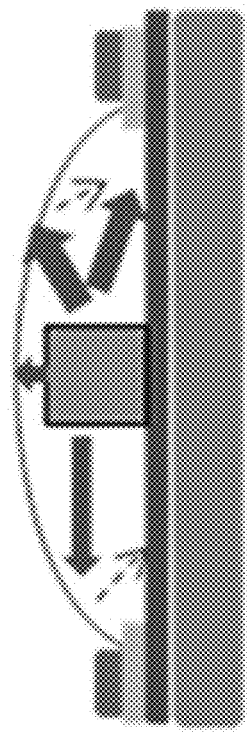
FIG. 7A is a diagram showing a path of light emitted by a light emitting device according to one embodiment of the present disclosure.
Figure 7B:
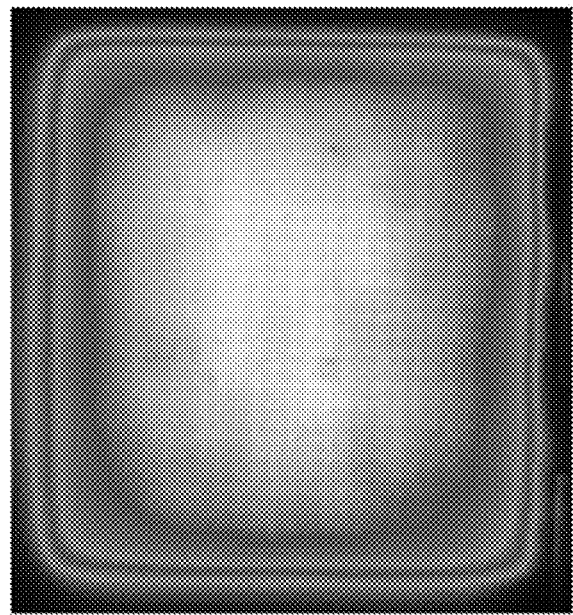
FIG. 7B is a schematic diagram showing the uniformity of light emitted by a light emitting device according to one embodiment of the present disclosure.

FIG. 7A is a diagram showing a path of light emitted by the light emitting device 60 according to one embodiment of the present disclosure. FIG. 7B is a schematic diagram showing the uniformity of light emitted by the light emitting device 60 according to one embodiment of the present disclosure. FIG. 7C is a diagram showing a path of light emitted by the light emitting device 60 according to another embodiment of the present disclosure. FIG. 7D is a schematic diagram showing the uniformity of light emitted by the light emitting device 60 according to another embodiment of the present disclosure. It is noted that FIGS. 7A and 7B show the light emission path and uniformity of the light emitting device 60 under the design where the height H between the highest point of the encapsulating layer 460 and the upper surface of the first reflective layer 430 is 0.1 times the outer diameter Dout. FIGS. 7C and 7D show the light emission path and uniformity of the light emitting device 60 under the design where the height H between the highest point of the encapsulating layer 460 and the upper surface of the first reflective layer 430 is 0.5 times the outer diameter Dout. In various embodiments where the height H is 0.1 times to 0.5 times the outer diameter Dout, it can be understood that when the height H is closer to 0.5 times the outer diameter Dout, the light emission uniformity of the light emitting device 60 is better.

Figure 8A:
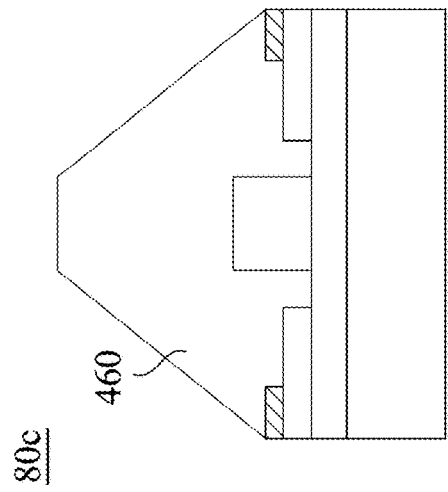
FIGS. 8A, 8B, 8C, and 8D illustrate cross-section schematic views of a light emitting device according to various embodiments of the present disclosure.
Figure 8B:
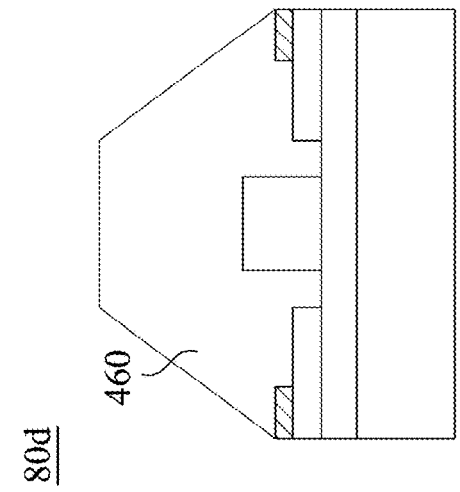

FIGS. 8A and 8B illustrate cross-section schematic views of a light emitting device 80a and 80b according to various embodiments of the present disclosure. As shown in FIGS. 8A and 8B, the encapsulating layer 460 of the light emitting device 80a and 80b has a width gradually decreasing by a constant amount from bottom to top and has an arc-shaped top surface. From the schematic cross-sectional view, the slope of the sidewalls of the light emitting device 80a and 80b is a certain value. The difference between the light emitting device 80a and the light emitting device 80b is that a radius of curvature of the arc-shaped top surface of the encapsulating layer 460 of the light emitting device 80a is smaller than that of the encapsulating layer 460 of the light emitting device 80b. Compared with the light emitting device 80a, the arc-shaped top surface of the encapsulating layer 460 of the light emitting device 80b is a relatively smooth arc-shaped top surface. In some embodiments, the sidewalls of the encapsulating layer 460 of the light emitting device 80a and 80b may be flattened by post-processing.

Figure 8C:
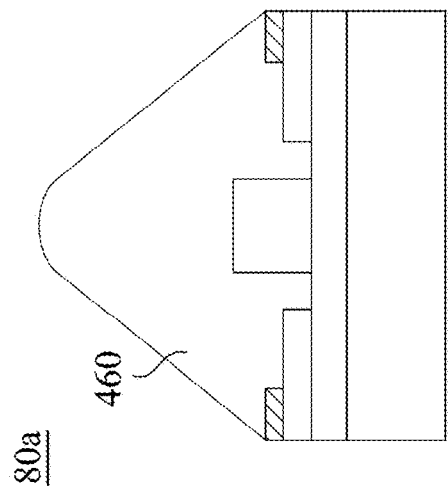
Figure 8D:
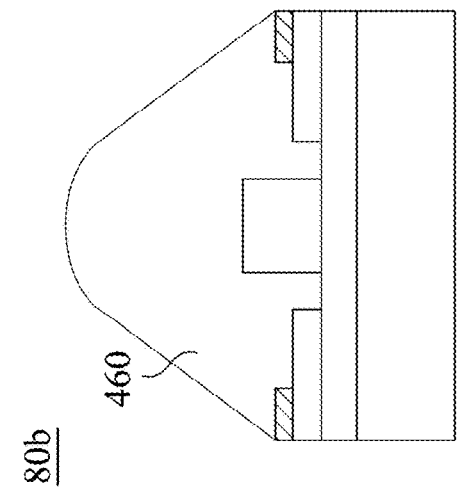

FIGS. 8C and 8D illustrate cross-section schematic views of a light emitting device 80c and 80d according to various embodiments of the present disclosure. As shown in FIGS. 8C and 8D, the encapsulating layer 460 of the light emitting device 80c and 80d has a width gradually decreasing by a constant amount from bottom to top, and the encapsulating layer has a flat top surface. From the schematic cross-sectional view, the slope of the sidewalls of the encapsulating layer 460 of the light emitting device 80c and 80d is a certain value. The difference between the light emitting device 80c and the light emitting device 80d is that the area of the flat top surface of the encapsulating layer 460 of the light emitting device 80c is smaller than that of encapsulating layer 460 of the light emitting device 80d. In some embodiments, the arc-shaped top surfaces of the light emitting device 80a and 80b may be processed into flat top surfaces by a post-processing planarization process, such as grinding or flat polishing.

Figure 9A:
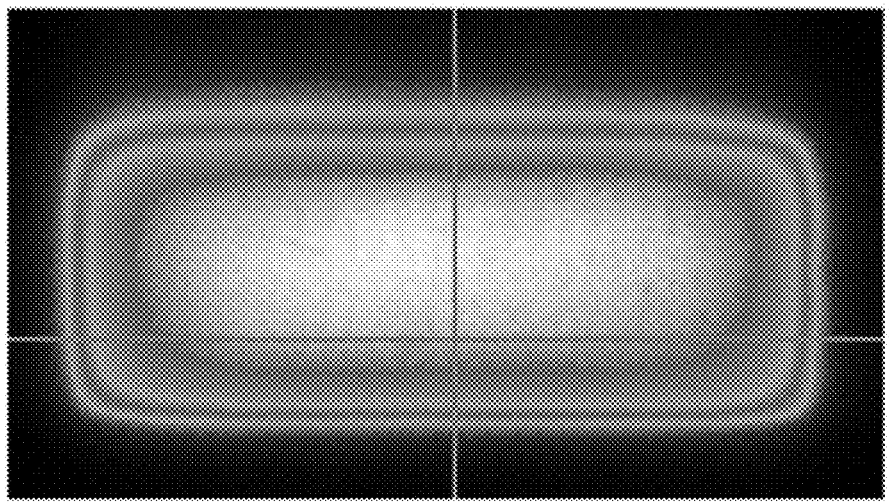
FIGS. 9A and 9B are schematic diagrams showing the light emission uniformity before and after processing the encapsulating layer of a light emitting device according to one embodiment of the present disclosure.
Figure 9B:
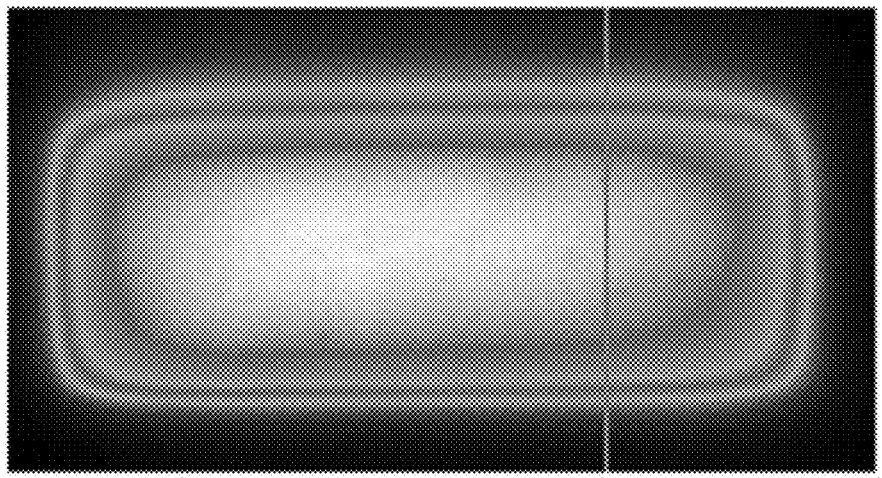

FIGS. 9A and 9B are schematic diagrams showing the light emission uniformity before and after processing the encapsulating layer of a light emitting device according to one embodiment of the present disclosure. FIG. 9A is a schematic diagram of the light emission uniformity of the encapsulating layer of the light emitting device without post-processing. FIG. 9B is a schematic diagram of the light emission uniformity of the encapsulating layer of the light emitting device after post-processing. It can be seen from FIGS. 9A and 9B that the light emitting device after post-processing has better light emission uniformity than the light emitting device without post-processing.

Figure 10:
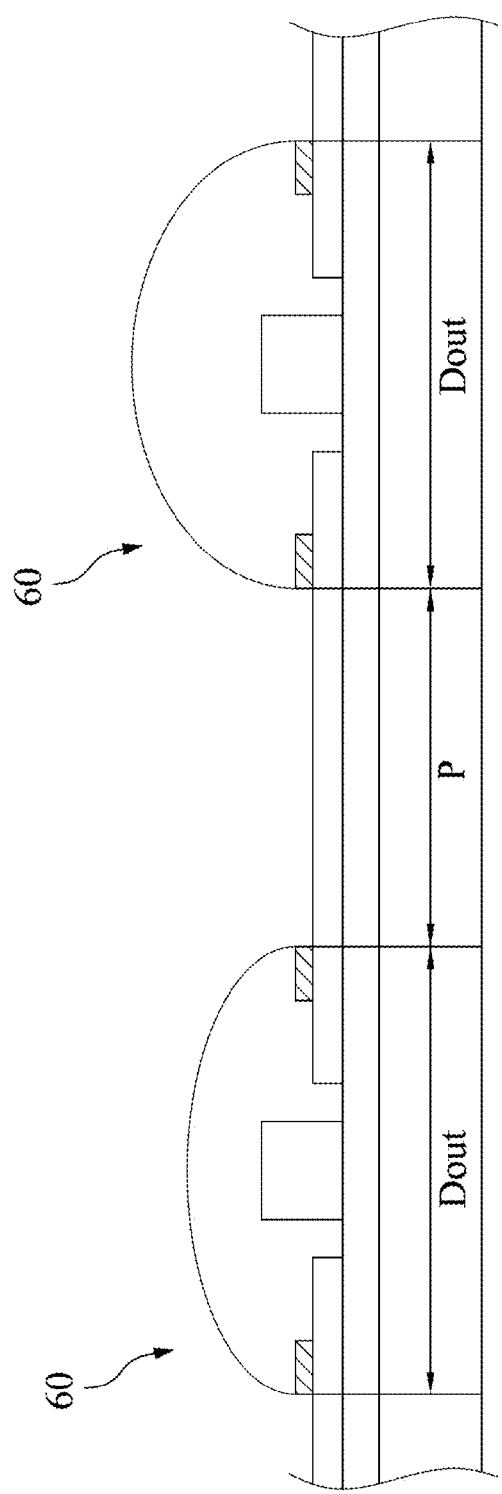
FIG. 10 illustrates a cross-section schematic view of a backlight according to one embodiment of the present disclosure.

FIG. 10 illustrates a cross-section schematic view of a backlight 90 according to one embodiment of the present disclosure. As shown in FIG. 10, the backlight 90 includes a plurality of light emitting devices (40, 60, 80a, 80b, 80c, 80d, or combinations thereof) foregoing. It is noted that any two adjacent light emitting devices are separated by a distance P, and the outer diameter Dout is less than 0.5 times the distance P. This design may reduce the amount encapsulating glue of the backlight 90 overall. For example, the amount encapsulating glue may be reduced by more than 80%, thereby reducing costs and enhancing the market competitiveness of products.

Figure 11:
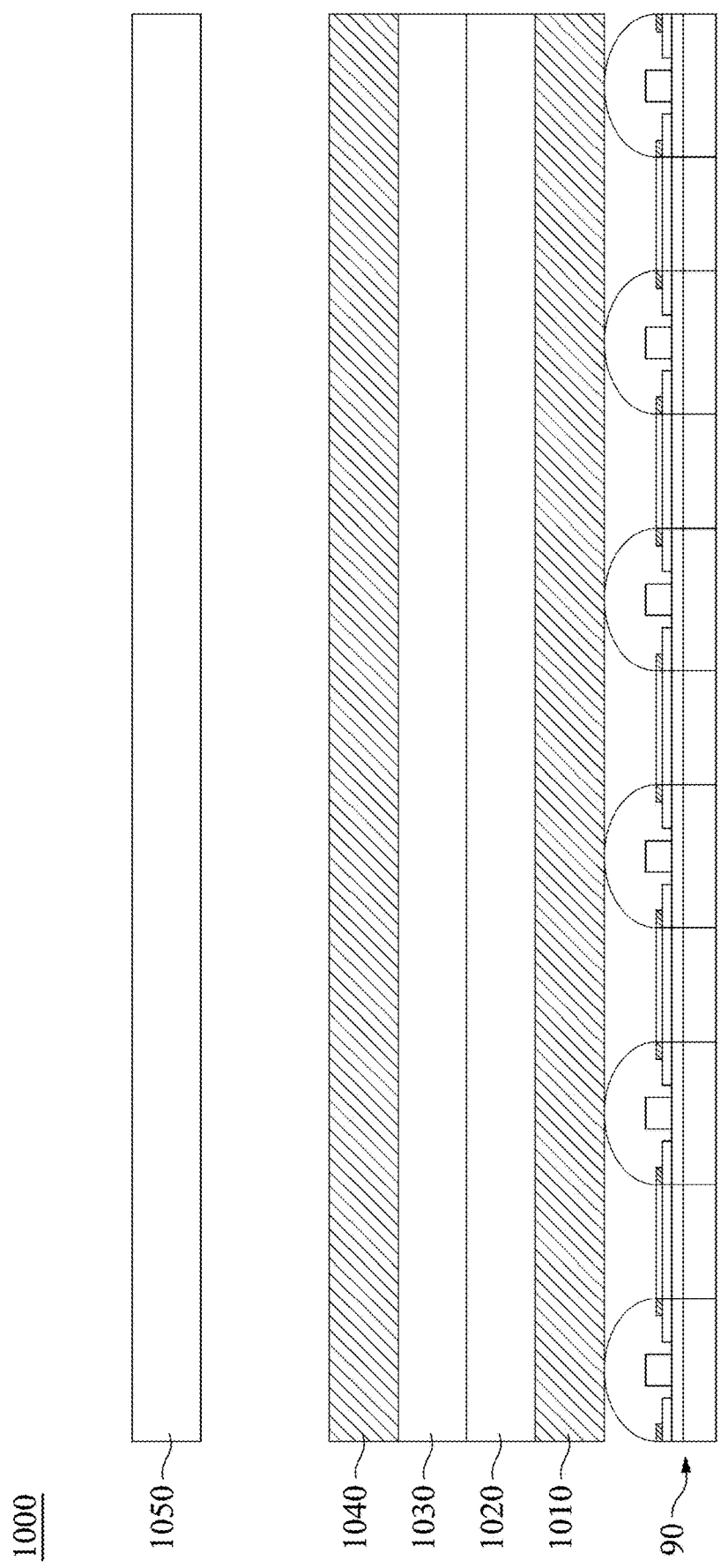
FIG. 11 illustrates a cross-section schematic view of a display panel according to one embodiment of the present disclosure.

FIG. 11 illustrates a cross-section schematic view of a display panel 1000 according to one embodiment of the present disclosure. As shown in FIG. 11, the display panel 1000 includes the backlight 90 foregoing, a lower diffuser 1010, a quantum dot layer 1020, an optical film 1030, an upper diffuser 1040, and a liquid crystal panel 1050. To be specific, the lower diffuser 1010 is disposed on the backlight 90. The lower diffuser 1010 is used to increase a brilliancy of the display panel 1000.

Referring to FIG. 11, the quantum dot layer 1020 is disposed on the lower diffuser 1010. In some embodiments, the quantum dot layer 1020 includes a red quantum dot, a green quantum dot, a blue quantum dot, or combinations thereof. The quantum dot layer 1020 can make the display panel 1000 have higher color purity and stronger color expression.

Referring to FIG. 11, the optical film 1030 is disposed on the quantum dot layer 1020. In some embodiments, the optical film 1030 includes a prism sheet or a brightness enhancement film (BEF). It can be understood that the number of the optical film 1030 is not limited to one as shown in FIG. 11, and the number of the optical film 1030 may be two or more depending on design requirements. The main function of the optical film 1030 is to achieve light collection, enhancement of the front light emission, and increase of the brightness through the refraction and reflection of light. When the light diffuses out through the lower diffuser, the travelling direction of the light is not concentrated and the directivity of the light is poor. Using the optical film 1030 to correct the travelling direction of the light may greatly increase the overall brightness of the display panel 1000.

Referring to FIG. 11, the upper diffuser 1040 is disposed on the optical film 1030. The upper diffuser 1040 may improve the light distribution to expand the field of view. The upper diffuser 1040 may also make the light emitted by the subsequent liquid crystal panel more uniform, so that the display panel 1000 may have a soft and uniform surface light source.

Referring to FIG. 11, the liquid crystal panel 1050 is disposed over the upper diffuser 1040. In other embodiments, the display panel 1000 may further include other optical components commonly used in this field to better enhance the visual performance of the display panel 1000.

In summary, the second reflective layer of the light emitting device of the present disclosure can control and divide accurately each light emitting element. By effectively adjusting the height of the encapsulating layer to control the amount of glue materials to achieve the purpose of reducing production costs and improving product market competitiveness. In addition, precisely controlling the relative relationship between the outer diameter of the second reflective layer and the height of the encapsulating layer can further improve the visual effects of the light emitting device and applications thereof (for example, backlights and display panels).

Although the present disclosure has been described in considerable detail with reference to certain embodiments thereof, other embodiments are possible. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A light emitting device, comprising:
a substrate;
a conductive layer disposed on the substrate;
a first reflective layer covering the conductive layer, the first reflective layer having an opening exposing a portion of the conductive layer;
a light emitting element disposed in the opening and electrically connected to the conductive layer;
a second reflective layer disposed on the first reflective layer and surrounding the light emitting element, the second reflective layer having an outer diameter, wherein a top surface of the second reflective layer is lower than a top surface of the light emitting element, wherein a height of the light emitting element is greater than a sum of heights of the first reflective layer and the second reflective layer; and
an encapsulating layer covering the light emitting element, a height between a highest point of the encapsulation layer and an upper surface of the first reflective layer being 0.1 to 0.5 times the outer diameter, wherein the encapsulating layer is in direct contact with the outer diameter of the second reflective layer.

2. The light emitting device of claim 1, wherein the second reflective layer has an inner diameter, and a difference between the outer diameter and the inner diameter ranges from 0.05 mm to 0.6 mm.

3. The light emitting device of claim 1, wherein the first reflective layer and the second reflective layer respectively comprise a white ink.

4. The light emitting device of claim 1, wherein the second reflective layer has a thickness, and the thickness ranges from 20 um to 60 um.

5. The light emitting device of claim 1, wherein the outer diameter ranges from 2.0 mm to 4.5 mm.

6. The light emitting device of claim 1, wherein the encapsulating layer has an arc-shaped outer surface.

7. The light emitting device of claim 1, wherein the encapsulating layer has a width gradually decreasing by a constant amount from bottom to top, and the encapsulating layer has an arc-shaped top surface.

8. The light emitting device of claim 1, wherein the encapsulating layer has a width gradually decreasing by a constant amount from bottom to top, and the encapsulating layer has a flat top surface.

9. A backlight, comprising:

a plurality of light emitting devices of claim 1, wherein any two adjacent light emitting devices are separated by a distance, and the outer diameter is less than 0.5 times the distance.

10. A display panel, comprising:

the backlight of claim 9;

a lower diffuser disposed on the backlight;

a quantum dot layer disposed on the lower diffuser;

an optical film disposed on the quantum dot layer;

an upper diffuser disposed on the optical film; and a liquid crystal panel disposed over the upper diffuser.

11. The display panel of claim 10, wherein the optical film comprises a prism sheet.

12. The display panel of claim 10, wherein the optical film comprises a brightness enhancement film.

13. The display panel of claim 10, wherein the quantum dot layer comprises a red quantum dot, a green quantum dot, a blue quantum dot, or combinations thereof.

* * * * *